United States Patent [19]
Nakasuji

[11] Patent Number: 6,110,627
[45] Date of Patent: Aug. 29, 2000

[54] CHARGED-PARTICLE-BEAM TRANSFER METHODS EXHIBITING REDUCED RESIST-HEATING EFFECTS

[75] Inventor: Mamoru Nakasuji, Yokohama, Japan

[73] Assignee: Nikon Corporation, Tokyo, Japan

[21] Appl. No.: 09/309,314

[22] Filed: May 11, 1999

[30] Foreign Application Priority Data

May 11, 1998 [JP] Japan .................................. 10-142061

[51] Int. Cl.⁷ ...................................... G03F 9/00

[52] U.S. Cl. ............................. 430/30; 430/296

[58] Field of Search ....................... 430/30, 296

[56] References Cited

U.S. PATENT DOCUMENTS 5,935,744   8/1999   Nakajima ............................... 430/296

FOREIGN PATENT DOCUMENTS 90-143516   6/1990   Japan .

OTHER PUBLICATIONS

Liddle et al., "Proximity Effect Correction in Projection Electron Beam Lithography (Scattering with Angular Limitation Projection Electron–Beam Lithography)," *Jpn. J. Appl. Phys.* 34:6672–6678 (1995).

*Primary Examiner*—Christopher G. Young
*Attorney, Agent, or Firm*—Klarquist Sparkman Campbell Leigh & Whinston, LLP

[57] ABSTRACT

Charged-particle-beam (e.g., electron-beam) microlithography methods are disclosed that solve problems of poor accuracy of transferred pattern features caused by resist-heating effects and proximity effects. The methods can be used when the pattern is defined by a stencil reticle or a membrane ("scattering") reticle. With a stencil reticle defining features ordinarily exhibiting excessive resist heating (and consequent "thickening") when transferred, each culprit feature is divided into multiple separate feature groups. Each feature group is separately transferred to the substrate. The complete feature as transferred includes non-exposed regions, especially in interior regions of the feature. With a membrane reticle, culprit features include CPB-blocking regions that also form non-exposed regions inside the respective features as exposed. As a result, resist-heating effects are reduced without adversely affecting the edge profile of the features as transferred.

20 Claims, 4 Drawing Sheets

CHARGED-PARTICLE-BEAM TRANSFER METHODS EXHIBITING REDUCED RESIST-HEATING EFFECTS

FIELD OF THE INVENTION

This invention pertains, inter alia, to charged-particle-beam (especially electron-beam) microlithography methods, especially such methods for projection-transferring, onto the surface of a semiconductor wafer or other suitable substrate, a pattern having minimum linewidths of 0.1 $\mu$m or less with high accuracy and high throughput with minimal adverse effect on transfer accuracy caused resist-heating effects and proximity effects.

BACKGROUND OF THE INVENTION

The so-called resist-heating effect that occurs during variable-shaped-spot beam delineation (using, e.g., an electron beam) is well known. As a result of resist heating, the size of a pattern feature as transferred is smaller when a beam with a small transverse surface area is used for delineation, compared to when a beam with a larger transverse surface area is used. The resist-heating effect arises due to increases in resist temperature as the resist is being exposed by an electron beam, with consequent increase in resist sensitivity. The resist-heating effect is not limited to variable-shaped-spot beam delineation, but rather is encountered in all technologies utilizing a charged particle beam to transfer a pattern having features with various shapes and surface areas.

The resist-heating effect can be corrected in conventional variable-shaped-spot beam delineation methods by changing the exposure dose (e.g., by changing the exposure duration) applied by the shaped beam directed to an exposure unit of the pattern. See Japanese published patent document no. Kokai Hei 2-143516. However, the resist-heating effect conventionally cannot be corrected in charged-particle-beam projection-exposure systems by changing the duration of exposure applied to any of the exposure units of the pattern.

In one type of conventional hybrid exposure (Japanese patent publication no. Kokai Hei 8-314121) termed a "cell projection" method, regions on a reticle having a high density of pattern openings (e.g., for memory chips) are divided into cells each having a smaller number of openings than required for a conventional feature pattern. In such methods, however, uneven edges of features can occur.

A reticle used for electron-beam projection microlithography can be a "stencil" reticle or a "scattering" ("membrane") reticle. (U.S. Pat. No. 5,130,213.) Using a stencil reticle, it not possible to define a donut-shaped feature. As a result, a stencil reticle having such a feature is divided into two complementary stencil reticles each defining a portion of such a feature. The resulting double exposure of certain features can cause resist-heating effects. Unfortunately, no technology exists for correcting the resist-heating effect encountered with use of complementary stencil reticles. Scattering reticles are also subject to resist-heating effects, especially with relatively large features defined by such reticles.

SUMMARY OF THE INVENTION

In view of the foregoing, an object of the present invention is to provide charged-particle-beam (e.g., electron-beam) projection-microlithography methods that can form micro-features having minimum linewidths of 0.1 $\mu$m or less with high accuracy and high throughput, while correcting problems of poor feature accuracy caused by resist-heating effects and proximity effects.

According to a first aspect of the invention, methods are provided for microlithographically transferring a pattern, defined by a reticle, onto a resist-coated substrate using a charged particle beam. The pattern includes a feature tending to exhibit resist heating or proximity effects when exposed onto an exposure location on the resist-coated surface by the charged particle beam.

According to a first embodiment of such a method, the pattern is defined by a stencil reticle. If each feature size is larger than a previously defined threshold size, the feature is divided into first and second sets of feature portions. The first set of feature portions is defined separately from the second set of feature portions such that each set is separately exposed at the exposure location, and the first and second exposed sets collectively form the complete feature at the exposure location. Through such division, the rise in resist temperature due to exposure to the beam is half or less than the rise that would otherwise be encountered if the feature were not divided. The feature portions in each set are configured to reduce, as the complete feature is being exposed on the exposure location, a net dose of charged particles imprinting the feature at the exposure location compared to a net dose of charged particles that would otherwise imprint the feature at the exposure location if the feature were not divided. The resistheating effect is reduced because the surface area of each set of pattern portions (each of which sets is exposed once to form a feature at a particular location on the substrate) is reduced compared to not dividing the feature according to this embodiment.

More specifically, the feature portions can be configured in each set such that the complete feature as imprinted at the exposure location has an interior region including a non-exposed region. Yet more specifically, the feature can have a rectangular profile including opposing short sides and opposing long sides, wherein the feature portions as imprinted extend parallel to the short sides. (In the feature as imprinted, the sides thereof can define, by way of example, a surface area of at least 100 $\mu$m$^2$, wherein each short side measures at least 10 $\mu$m in length.) The interior region can include multiple non-exposed regions arranged parallel to each other, wherein each non-exposed region extends lengthwise between respective flanking feature portions. Typically, the pattern is transferred onto the substrate using a projection-optical system; in such an instance, each non-exposed portion has a width that is no greater than two times the resolving power of the projection-optical system.

Preferably, the non-exposed regions do not extend to peripheral edges of the imprinted feature. Further preferably, each non-exposed region has a width that extends parallel to the long side of the feature. The width is preferably wider than the width of a flanking feature portion.

Each non-exposed region typically has opposing ends. Each end extends toward but preferably does not reach the respective long side of the feature. Also, the width of each end of each non-exposed region is preferably zero.

Positive patterns, as defined on stencil reticles, with large feature sizes are easily thickened by proximity effects. The embodiments summarized above effectively reduce the CPB dose at the feature and improve the accuracy with which the feature shape is reproduced on the substrate.

According to a second embodiment, the pattern is defined by a membrane reticle. The feature is defined on the reticle by a corresponding charged-particle-beam (CPB) transmitting void in a layer of CPB-scattering material deposited on a membrane. The void has an interior region including at least one CPB-scattering body so as to reduce, as the feature is being exposed on the exposure location, a net dose of charged particles imprinting the feature at the exposure location compared to a net dose of charged particles that would otherwise imprint the feature at the exposure location if the scattering body were not included in the interior region. The feature can have a rectangular profile including opposing short sides and opposing long sides, wherein the CPB-scattering body comprises multiple finger-shaped portions extending parallel to each other and parallel to the short sides. Preferably, each finger-shaped portion has a length that does not extend to a corresponding long side. Also, if a projection-optical system is used, each finger-shaped portion preferably has a width that is no greater than two times the resolving power of the projection-optical system.

According to either embodiment, feature edges can be reproduced on the substrate with high accuracy and distinctness. This is facilitated by configuring the non-exposed portions to be narrower at their respective ends than in center regions of the non-exposed portions.

By having the width of the non-exposed portions be no more than two times the resolution of the projection-optical system (as established using simulation methods), backscattered charged particles from the periphery of the respective feature are captured to contribute to exposure of the feature.

Because certain problems encountered with stencil reticles do not occur with membrane reticles, positive features as defined on the membrane reticle can include multiple island-shaped non-exposed regions. This makes it possible to reduce resist-heating effects and proximity effects.

The foregoing and additional features and advantages of the invention will be more readily apparent from the following detailed description, which proceeds with reference to the accompanying drawings.

BRIEF DESCRIPTION OF THE DRAWINGS

FIG. 2(A) shows an entire positive feature having a desired shape (profile) as transferred onto a substrate, FIGS. 2(B) and 2(C) depict first and second complementary groups, respectively, of positive feature portions collectively defining the feature shown in FIG. 2(A), and FIG. 2(D) depicts non-exposed regions existing in spaces between the portions of FIGS. 2(B) and 2(C) when the complementary groups of feature portions of FIGS. 2(B) and 2(C) are lined up with each other in a way suitable for producing the feature of FIG. 2(A).

FIG. 3(A) shows an entire positive feature having a desired profile as transferred onto a substrate, FIG. 3(B) shows a scattering-body pattern on a membrane reticle for producing the feature of FIG. 3(A), and FIG. 3(C) is an enlargement of a portion of a tip of a non-exposed region.

DETAILED DESCRIPTION

Figure 1:
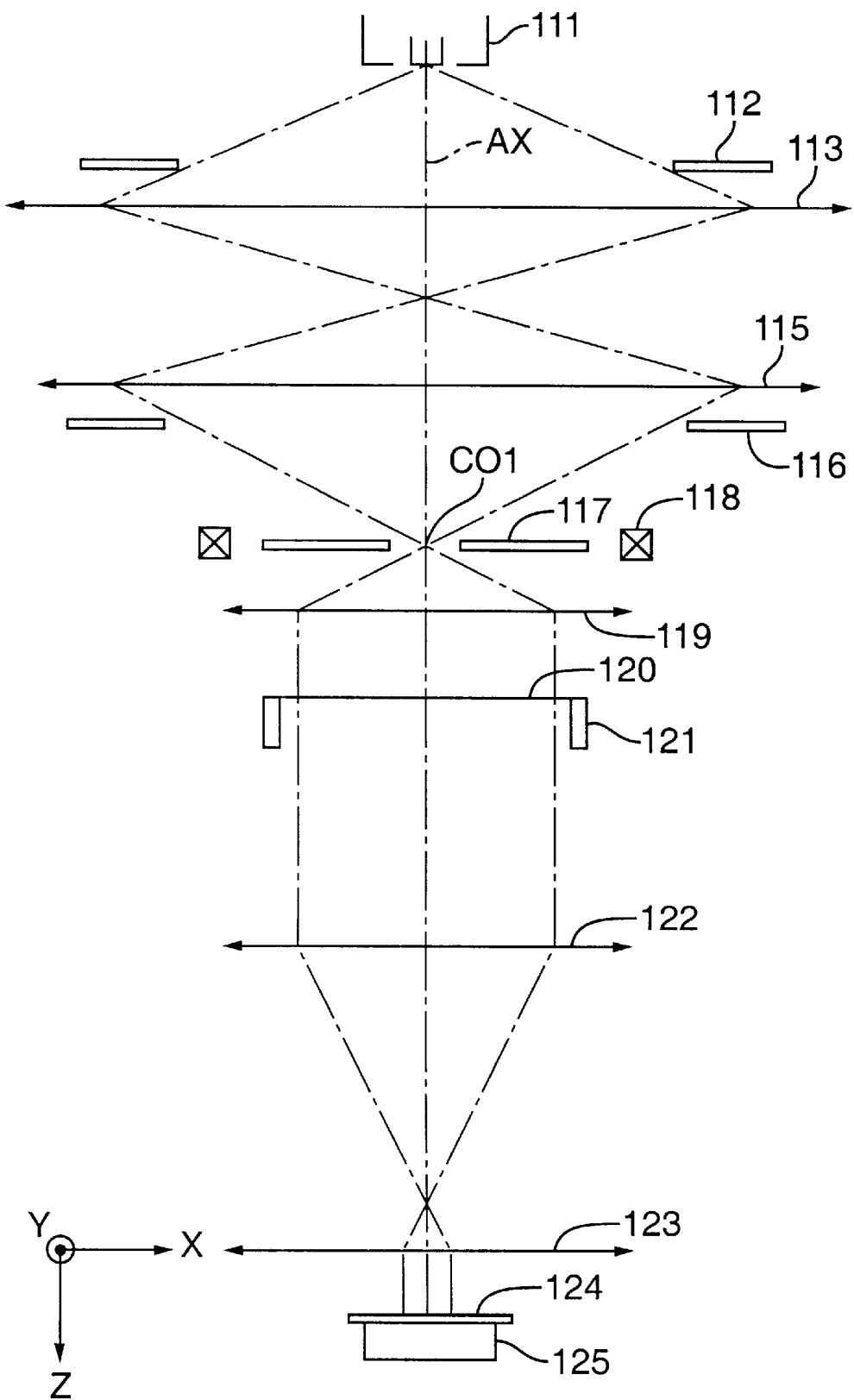
FIG. 1 is a schematic optical diagram of general features of an electron-beam microlithography apparatus with which methods according to the invention can be executed.

Referring first to FIG. 1, major components of an electron-beam microlithographic apparatus are shown. The FIG. 1 apparatus is particularly suitable for producing a demagnified image, on a substrate, of a reticle pattern. FIG. 1 also depicts certain image-forming relationships in the "optical" system of a "divided" transfer-type electron-beam projection-exposure apparatus.

An electron gun 111 emits an electron beam in a downstream direction along an optical axis AX. First and second condenser lenses 113, 115, respectively, are disposed downstream of the electron gun 111. The electron beam passes through the condenser lenses 113, 115 and converges at a crossover CO1 on the axis AX at the same location as a blanking aperture 117. The condenser lenses 113, 115 function as a two-stage zoom lens that can vary the beam-current density irradiated on a downstream reticle 120.

A first aperture 112 (preferably rectangular) is situated upstream of the condenser lenses 113, 115, and a second rectangular aperture 116 (preferably rectangular) is disposed downstream of the condenser lenses 113, 115. The apertures 112, 116 limit the size and shape of the area on the reticle illuminated by the electron beam, by which is meant that the apertures 112, 116 allow passage therethrough of a portion of the electron beam sufficient to illuminate a portion of the reticle 120 equal in area to one exposure unit. For example, the first aperture 112 shapes the transverse profile of the electron beam, used to illuminate the reticle, into a 1-mm square. An image of the first aperture 112 is formed at the second aperture 116 by the condenser lenses 113, 115.

A "selection" deflector 118 is provided upstream of the reticle 120 for deflecting the beam to a selected illumination region on the reticle 120. The selection deflector 118 is axially aligned with a blanking aperture 117 situated at the crossover CO1. The selection deflector 118 sequentially scans the beam in the X-direction of FIG. 1 so as to sequentially illuminate rows (each row representing a "subfield") in a main field of the reticle. A third condenser lens 119 is situated downstream of the selection deflector 118. The third condenser lens 119 collimates the electron beam to be incident on the reticle 120 on which an image of the second aperture 116 is formed.

In FIG. 1, although only one subfield on the reticle 120 is shown, it will be understood that the reticle typically comprises many subfields that extend over the reticle in X- and Y-directions. Also, the reticle 120 typically includes multiple main fields. The main fields are arranged in one or more "stripes" that collectively constitute a complete "die." Within a main field, as each subfield is illuminated and exposed, the electron beam is deflected as required by the selection deflector 118.

The reticle 120 is mounted on a reticle stage 121 that is movable in the X- and Y-directions. A wafer 24 (i.e., photosensitive substrate) is mounted on a wafer stage 125 that is also movable in the X- and Y-directions. Each main field within a stripe of the die (wherein a stripe comprises multiple rows of the main field) is continuously exposed by coordinated scanning motions of the reticle stage 121 and the wafer stage 125 in opposite directions along the Y-axis. Each stripe is exposed by intermittent coordinated scanning motions of the stages 121, 125 in the X-direction. Each stage 121, 125 is equipped with one or more accurate position-measurement systems each typically employing a laser interferometer. Each subfield and each main field, as projected, are accurately "stitched" together on the wafer 124 by respective alignment means and deflectors (not shown) used to position the beam at exactly the desired location on the wafer surface.

First and second projection lenses 122, 123, respectively (collectively constituting a two-stage objective lens) and a deflector (not shown) are situated downstream of the reticle 120. The subfields on the reticle 120 are illuminated sequentially by the electron beam. As the electron beam passes through the illuminated subfield, the beam becomes "patterned" by which is meant that the beam acquires an ability to form an image of the illuminated subfield. The patterned beam is demagnifyingly refracted by the projection lenses 122, 123 so as to form the image at a fixed position on the wafer 124. (To make the wafer imprintable with the pattern, the upstream-facing surface of the wafer is coated with a suitable resist.) As the selected region of the wafer 124 receives a dose of the electron beam passing through the illuminated subfield, the resist at that region becomes imprinted with the image of the subfield, thereby completing "transfer" of the image to the wafer.

Figure 2A:
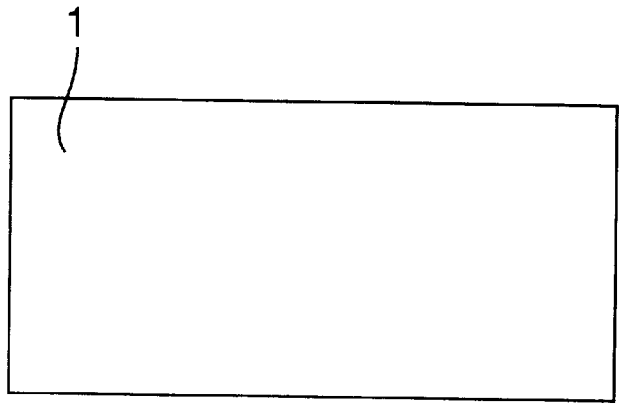
FIGS. 2(A)–2(D) are schematic plan views illustrating an electron-beam microlithographic transfer method according to a first representative embodiment of the invention.
Figure 2B:
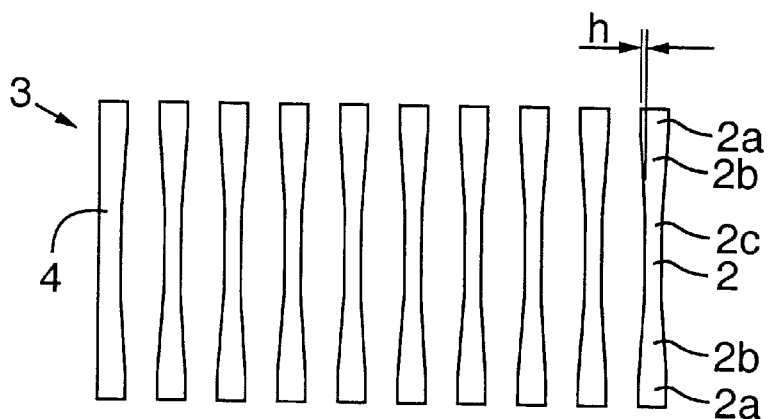
Figure 2C:
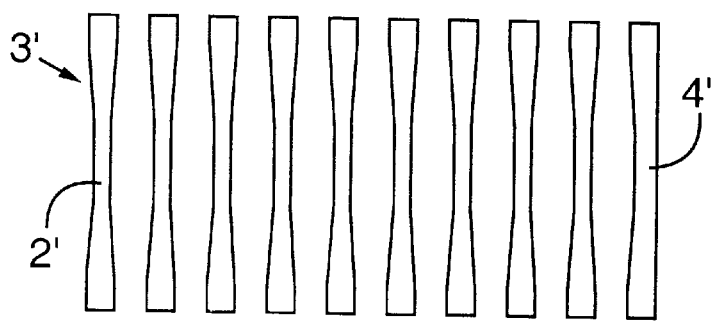
Figure 2D:
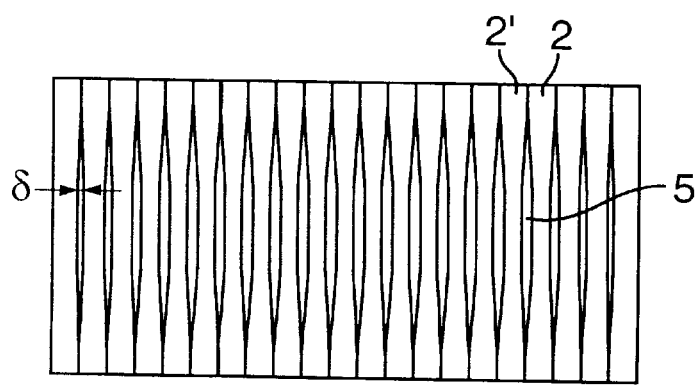

A first representative embodiment of the invention is illustrated in FIGS. 2(A)–2(D). FIG. 2(A) schematically depicts an entire positive feature 1; FIGS. 2(B) and 2(C) depict the feature 1 of FIG. 2(A) divided into first and second groups of positive feature portions as defined on one or more stencil reticles. I.e., the group in FIG. 2(B) is complementary to the group in FIG. 2(C) and can be defined on the same stencil (although in different subfields) or on separate stencil reticles. FIG. 2(D) shows the feature portions of FIGS. 2(B) and 2(C) combined with each other as they would be after exposure onto the wafer, leaving non-exposed regions within spaces situated between adjacent feature portions.

By way of example, the feature 1 is rectangularly shaped 10 $\mu$m wide and 20 $\mu$m long as projected onto the wafer. If the demagnification ratio achieved by the projection lenses 122, 123 is ¼(by which is meant that the image of a feature as formed on the wafer 124 is ¼the size of the corresponding feature on the reticle 120), then the feature 1 as defined on the stencil reticle 120 is four times larger than the feature 1 as projected. It will be understood that the reticle 120 defines a large number of features, some being as large as the feature 1 noted above, and other features being much smaller, e.g., features having linewidths of, say, 0.1 $\mu$m. With such a pattern (i.e., containing both "large" features such as the feature 1 shown in FIG. 2(A), and "small" features such as 0.1-$\mu$m features), resist heating will likely occur. The 0.1$\mu$m features tend to receive an insufficient dose, compared to larger features, of electrons for adequate feature definition as imprinted on the wafer. The usual remedy is to increase the electron dose. However, such an increase causes resist heating in the vicinity of the large features.

To prevent such a problem, according to this embodiment, the positive feature 1 is divided into multiple feature portions. By way of example, in FIGS. 2(B) and 2(C), the feature 1 is divided into twenty vertical linear feature portions. The feature portions are divided, in alternating order, between two complementary groups 3 and 3' of feature portions. Thus, each group 3, 3' comprises ten respective feature portions arranged in alternating order.

In FIG. 2(B), the left-most feature portion 4 in the group 3 has three rectilinear sides, the long side of which corresponds to the left edge of the feature 1. The top and bottom sides of the feature portion 4 each have a width that is ¹⁄₂₀$^{th}$ of the top or bottom width of the feature 1. The right side of the feature portion 4 is slightly concave, as are the left and right sides of all the other feature portions 2 in FIG. 2(B).

Similarly, in FIG. 2(C), the right-most feature portion 4' in the group 3' has three rectilinear sides, the long side of which corresponds to the right edge of the feature 1. The top and bottom sides of the feature portion 4' each have a width that is ¹⁄₂₀$^{th}$ of the top or bottom width of the feature 1. The left side of the feature portion 4' is slightly concave, as are the left and right sides of all the other feature portions 2' in FIG. 2(C).

Continuing with this example, in each of FIGS. 2(B) and 2(C), the top and bottom edges of each of the nine feature portions 2, 2', respectively, have a width that is ¹⁄₂₀th of the width of the top or bottom edges of the feature 1. In FIG. 2(B), the end portion 2a of the feature portion 2 has a width of 1 $\mu$m. The center portion 2c of any of the feature portions 2 has a width of 0.6 $\mu$m. The region 2b between the center portion 2c and each end portion 2a gradually increases in width from that of the center portion 2c to that of the end portion 2a. Hence, the region 2b is termed herein the "variable-width" portion. FIG. 2(B) also shows a width difference "h" representing half the difference of the width of the center portion 2c from the width of the end portion 2a. Thus, in this example, h=½(1.0–0.6)=0.2 $\mu$m. Further with this example, the length of the variable-width portion 2b is 2 $\mu$m and the length of each end portion 2a is 1 $\mu$m. Any change in the width of the non-exposed regions 5 (FIG. 2(D)) is reflected in a corresponding change in the width of the center portion 2c.

Referring further to FIG. 2(C), the feature portions 2' in the complementary group have shapes that are symmetrical with the shapes of the feature portions 2 in FIG. 2(B). Whenever the two complementary groups 3 and 3' are aligned with each other so as to define the feature 1, an array as shown in FIG. 2(D) is produced. In FIG. 2(D), the center portions of the feature portions have intervening spaces 5 (termed "non-exposed" regions). Each non-exposed region 5, residing between a respective feature portion 2 and feature portion 2', tapers on both ends to a respective point. Each non-exposed region 5 is not defined by a corresponding aperture within either the group 3 or the group 3'. Even if the projection lenses 122, 123 produce no blurring of the projected image, resist-heating effects or proximity effects can still occur. Despite such effects, the array of non-exposed regions 5 allows the shapes of the respective stencil apertures (defining the feature portions 2, 2', 4, 4') to be transferred onto the wafer with high fidelity, wherein the non-exposed regions 5 will appear as non-exposed regions on the wafer. If the width of each non-exposed region 5 is within approximately two times the resolution of the projection optical system, then the non-exposed regions 5 receive an exposure dose that sufficiently exceeds a threshold value as a result of resist-heating effects and proximity effects, thereby allowing the entire feature 1 to be accurately transferred. If the width of each non-exposed region 5 is larger than the resolution of the projection-optical system, then such non-exposed regions are easily formed on the reticle accurately.

In other words, the large size of the positive feature 1 makes it more susceptible, when exposed, to increases in size as projected due to proximity effects and resist heating. In order to prevent such feature "thickening," the accuracy of the feature size and shape, as projected, is improved by providing the array of non-exposed regions 5 that locally "absorb" the proximity-effect dose. As a result, the exposure dose received in the center regions of the feature 1 per complementary exposure is reduced to ³⁄₁₀, thereby lessening the resist-heating effect. Also, after the pattern portions 3 in FIG. 2(B) are exposed and up to the instant the pattern portions 3' in FIG. 2(C) are exposed, the resist has an opportunity to cool, thereby further reducing resist heating.

In this embodiment, because larger features are represented by an array of small pattern portions (which still are positive features along their edges), the edges of such larger features are distinctly formed without unevenness or other defects due to insufficient exposure.

As shown in FIGS. 2(B) and 2(D), each non-exposed region 5 has a maximal width δ that gradually narrows to zero at each end. Such a configuration allows a sufficient dosage to be applied to peripheral regions of the corresponding feature 1.

Figure 3A:
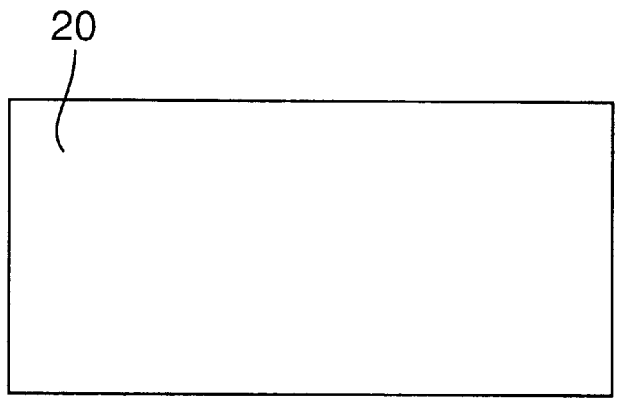
FIGS. 3(A)–3(C) are schematic plan views illustrating an electron-beam microlithographic transfer method according to a second representative embodiment of the invention.
Figure 3B:
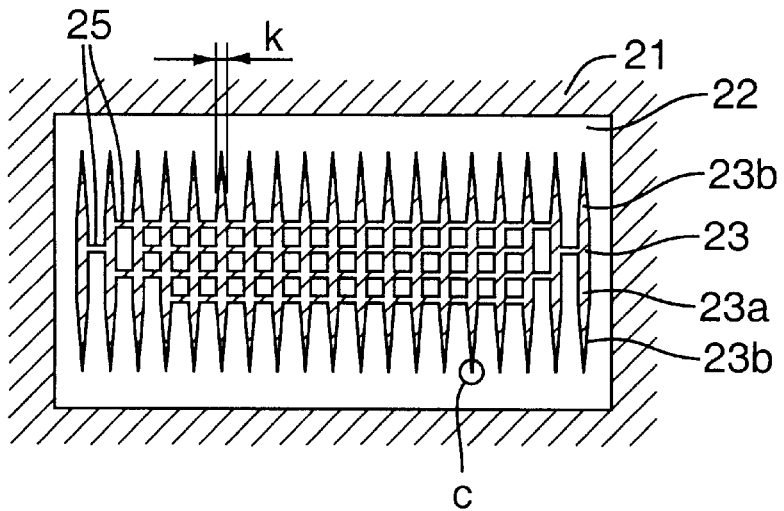
Figure 3C:
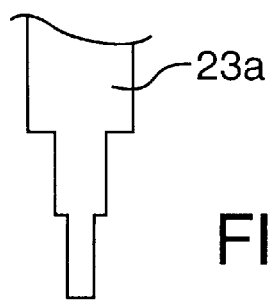

A second representative embodiment of the invention is shown in FIGS. 3(A)–3(C). A rectangular positive feature 20 to be transferred to a substrate is shown in FIG. 3(A). FIG. 3(B) shows details of the FIG. 3(A) feature as defined on a scattering ("membrane") reticle according to the invention, and FIG. 3(C) shows an enlargement of the non-exposed region labeled "C" in FIG. 3(B).

In this embodiment, the reticle is not a stencil-type (aperture-type) reticle as was the subject of the first representative embodiment. Rather, the reticle of the current embodiment is a "scattering" ("membrane") reticle. The membrane (typically made of silicon) of such a reticle has a thickness, by way of example, of 0.05 μm on which features are defined by a deposit of a heavy metal such as W or Ta. The membrane is transmissive to an electron beam, and the heavy-metal features ("scattering bodies") cause scattering of an incident electron beam.

In a membrane reticle according to this embodiment, contrast of a transferred image is achieved by the difference in scattering angle experienced by incident electrons on portions of the reticle having membrane only versus portions that include both the membrane and a scattering body.

Similar to the first representative embodiment, the entire feature of FIG. 3(A) is a rectangular-shaped positive feature that, when projected onto a wafer, measures (by way of example) 10 μm by 20 μm. FIG. 3(B) shows the corresponding feature as defined as a correspondingly shaped void in a layer 21 of electron-scattering material (e.g., heavy metal) deposited on a reticle membrane according to this embodiment. In FIG. 3(B), the hatched lines denote areas in which the layer 21 of electron-scattering material is deposited. I.e., the hatched lines designate areas in which a scattering body is present. Thus, areas on the substrate corresponding to the hatched-line area on the reticle are not exposed by the electron beam. The non-hatched areas represent a region 22 where only the membrane of the reticle is present and are thus regions that are transmissive to electrons in the beam. According to the invention, the region 22 collectively defines, when projected onto the substrate, the entire feature 20 in its desired rectangular profile.

More specifically, the region 22 shown in FIG. 3(B) includes an interior region populated by one or more non-exposed portions 23. In this example, multiple (twenty) finger-shaped non-exposed portions are included, each having opposing ends 23b that respectively taper to points. The non-exposed portions 23 are defined by corresponding deposits of electron-scattering material within the interior of the region 22. The non-exposed portions 23 are arrayed parallel to each other within the region 22, and each has a width "k" (by way of example, 0.8 μm) on the reticle. The length of each non-exposed portion 23 is, by way of example, 32 μm on the reticle. Adjacent edges of the region 22, the ends of each of the non-exposed portions 23 have a width of zero. In essence, the non-exposed portions 23 serve to reduce the electron dosage in the interior of the feature 20 as imprinted on the wafer.

In order to further regulate the electron dosage in the feature 20 as exposed, additional non-exposed portions 25 can be defined by the reticle (FIG. 3(B)). The number of the non-exposed portions 25 is preferably less toward the left and right ends of the region 22 to allow a sufficient dosage to be applied to the periphery of the feature 20 as projected.

Conventionally, if the width of each of the non-exposed portions 23 is larger than the resolution of the projection-optical system, patterning will occur but, if the resist is a positive resist, some resist will remain on the wafer. However, backscattering of electrons from the periphery of the feature causes the non-exposed regions 23 also to be exposed. (Simulation results indicate that a feature was not formed up to the width of approximately two times the resolution of the projection-optical system.) Thus, the width of each of the non-exposed portions 23 is preferably no more than two times the resolution (for example, 0.1 μm) of the projection-optical system used to project the reticle pattern.

The foregoing methods are especially applicable to features through which an electron beam must pass, but without causing a size increase of the projected feature greater than a specified amount. By placing non-exposed portions of certain larger features between exposed portions of such features, it is possible to reduce the dosage on features with large surface areas. Thus, it is possible to improve the accuracy by which the specific profiles of such features are transferred. Not placing such non-exposed portions along the edges of a positive feature allows feature edges on the wafer to be distinctly formed.

Figure 4:
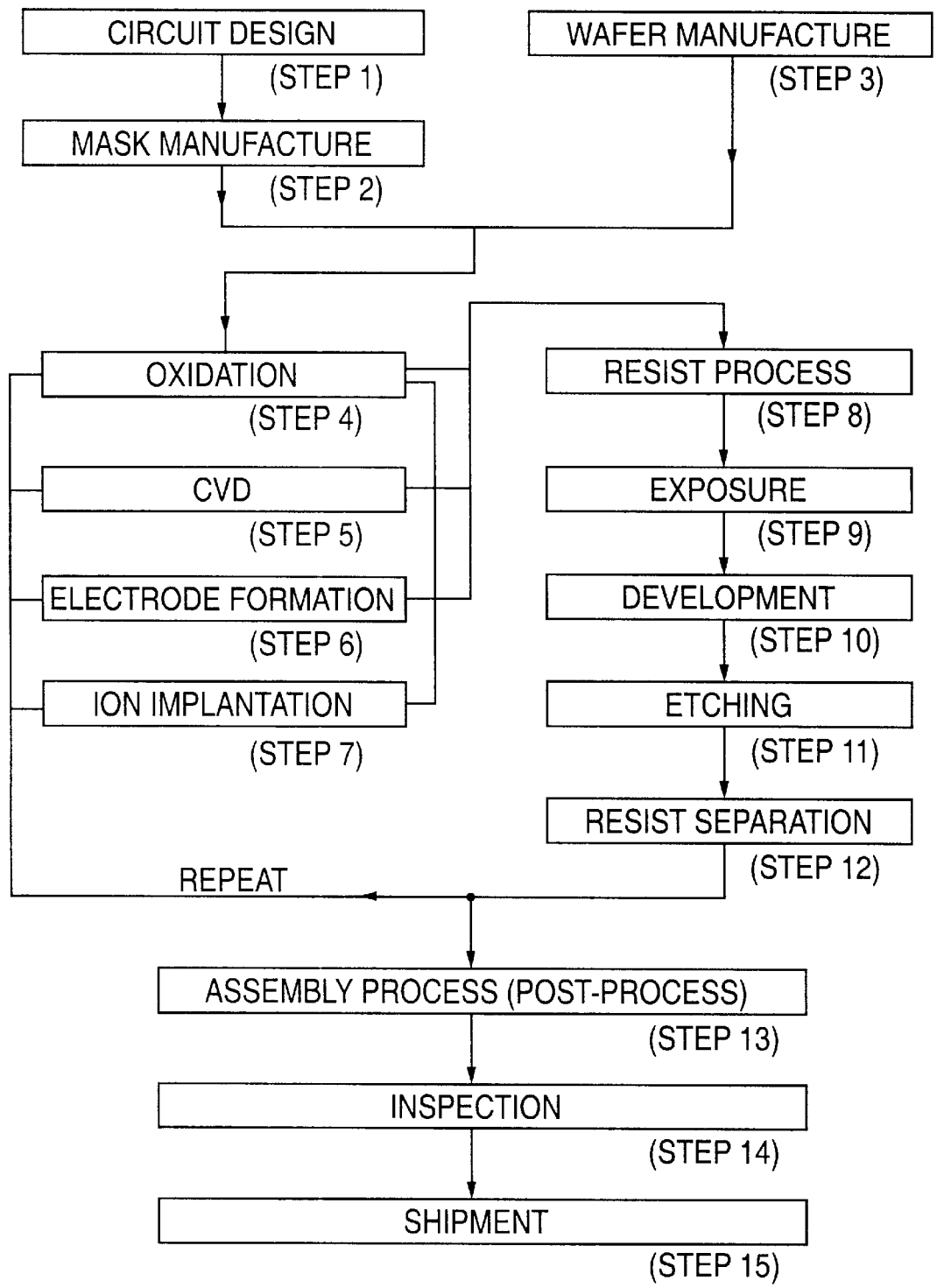
FIG. 4 is a flow chart of steps in a process, according to the invention, for manufacturing a semiconductor device such as a semiconductor chip (e.g., IC or LSI), a liquid-crystal panel, or CCD, for example.

FIG. 4 is a flow chart of steps in a process, according to the invention, for manufacturing a semiconductor device such as a semiconductor chip (e.g., IC or LSI), a liquid-crystal panel, or a CCD, for example. Step 1 pertains to designing the circuit pattern for the semiconductor device. Step 2 pertains to manufacturing a mask (reticle) defining the circuit pattern. Step 3 pertains to manufacturing a wafer from a material such as silicon.

Steps 4–12 are wafer-processing steps collectively termed "pre-process" steps in which, by using the mask and wafer prepared in steps 2 and 3, circuits are imprinted on the wafer by microlithography. Step 13 is an assembling step termed a "post-process" step in which the wafer processed by steps 4–12 is formed into semiconductor chips. This step includes assembling (dicing and bonding) and packaging (chip sealing). Step 14 is an inspection step in which operability checks, durability checks and quality-control procedures are performed on the semiconductor devices produced in step 13. With these steps, semiconductor devices are finished for shipment (step 15).

With respect to steps 4–12, step 4 involves oxidizing the surface of the wafer. Step 5 involves forming an insulating film on the wafer surface by chemical vapor deposition (CVD). Step 6 involves forming electrodes on the wafer by vapor deposition. Step 7 involves implanting ions in selected regions on the wafer. Step 8 involves applying a resist (photosensitive material) to the wafer surface. Step 9 is a microlithographic exposure step in which the circuit pattern defined by the reticle is exposed onto the wafer using the exposure apparatus and methods described above. Step 10 involves developing the exposed resist on the wafer. Step 11 involves etching to remove material from regions of the wafer other than the developed resist image. Step 12 involves separating (removing) the resist material remaining on the wafer after the wafer is etched. By repeating these steps as required, circuit patterns are superposedly formed on the wafer.

Whereas the invention has been described in connection with multiple representative embodiments, it will be understood that the invention is not limited to such embodiments. On the contrary, the invention is intended to encompass all modifications, alternatives, and equivalents as may be encompassed by the spirit and scope of the invention, as defined by the appended claims.

What is claimed is:

1. In a method for microlithographically transferring a pattern, defined by a reticle, onto a resist-coated substrate using a charged particle beam, wherein the pattern includes a feature tending to exhibit resist heating when exposed onto an exposure location on the resist-coated surface by the charged particle beam, an improvement comprising:

(a) if the pattern is defined by a stencil reticle and if the feature is larger than a predetermined value, then dividing the feature into first and second sets of feature portions and defining the first set of feature portions separately from the second set of feature portions such that each set is separately exposed at the exposure location such that the first and second exposed sets collectively form the complete feature at the exposure location; and (b) if the pattern is defined by a membrane reticle, then defining the feature on the reticle by a corresponding charged-particle-beam (CPB) transmitting void in a layer of CPB-scattering material deposited on a membrane, and if the void has a size that is larger than a predetermined value, then providing the void with an interior region including at least one CPB-scattering body.

2. The method of claim 1, wherein the feature portions in each set are configured to reduce, as the complete feature is being exposed on the exposure location, a net dose of charged particles imprinting the feature at the exposure location compared to a net dose of charged particles that would otherwise imprint the feature at the exposure location if the feature were not divided.

3. The method of claim 2, wherein:

the reticle is a stencil reticle; and the feature portions are configured in each set such that the complete feature as imprinted at the exposure location has an interior region including a non-exposed region.

4. The method of claim 3, wherein:

the feature has a rectangular profile including opposing short sides and opposing long sides; and the feature portions as imprinted extend parallel to the short sides.

5. The method of claim 4, wherein the interior region includes multiple non-exposed regions arranged parallel to each other, each non-exposed region extending lengthwise between respective flanking feature portions.

6. The method of claim 5, wherein:

the pattern is transferred onto the substrate using a projection optical system having a resolving power; and each non-exposed portion has a width that is no greater than two times the resolving power of the projection-optical system.

7. The method of claim 6, wherein each non-exposed portion has a width that is no less than the resolving power of the projection-optical system.

8. The method of claim 7, wherein each non-exposed region has a width, extending parallel to a long side, that is wider than a width of a flanking feature portion.

9. The method of claim 7, wherein each non-exposed region has opposing ends, each end extending toward but not reaching the respective long side of the feature.

10. The method of claim 7, wherein the width of each end of each non-exposed region is zero.

11. The method of claim 5, wherein the non-exposed regions do not extend to peripheral edges of the imprinted feature.

12. The method of claim 1, wherein:

the reticle is a stencil reticle;

the feature has a rectangular profile including opposing short sides and opposing long sides; and in the feature as imprinted, the sides thereof define a surface area of at least 100 $\mu m^2$ and each short side measures at least 10 $\mu m$ in length.

13. The method of claim 1, wherein:

the reticle is a membrane reticle;

the feature has a rectangular profile including opposing short sides and opposing long sides; and the CPB-scattering body comprises multiple finger-shaped portions extending parallel to each other and parallel to the short sides.

14. The method of claim 13, wherein each finger-shaped portion has a length that does not extend to a corresponding long side.

15. The method of claim 13, wherein:

the pattern is transferred onto the substrate using a projection-optical system having a resolving power; and each finger-shaped portion has a width that is no greater than two times the resolving power of the projection-optical system.

16. The method of claim 13, wherein each finger-shaped portion has a width that is no less than the resolving power of the projection-optical system.

17. The method of claim 1, wherein:

the reticle is a membrane reticle;

the feature has a rectangular profile including opposing short sides and opposing long sides; and in the feature as imprinted, the sides thereof define a surface area of at least 100 $\mu m^2$ and each short side measures at least 10 $\mu m$ in length.

18. In a method for microlithographically transferring a pattern, defined by a reticle, onto a resist-coated substrate using a charged particle beam, wherein the pattern includes a feature tending to exhibit resist heating when exposed onto an exposure location on the resist-coated surface by the charged particle beam, an improvement comprising:

(a) defining the pattern using a stencil reticle; and (b) dividing the feature into first and second sets of feature portions and defining the first set of feature portions separately from the second set of feature portions such that each set is separately exposed at the exposure location such that the first and second exposed sets collectively form the complete feature at the exposure location, the feature portions in each set being configured to reduce, as the complete feature is being exposed on the exposure location, a net dose of charged particles imprinting the feature at the exposure location compared to a net dose of charged particles that would otherwise imprint the feature at the exposure location if the feature were not divided.

19. In a method for microlithographically transferring a pattern, defined by a reticle, onto a resist-coated substrate using a charged particle beam, wherein the pattern includes a feature tending to exhibit resist heating when exposed onto an exposure location on the resist-coated surface by the charged particle beam, an improvement comprising:

(a) defining the pattern using a membrane reticle; and
(b) on the membrane reticle, defining the feature by a corresponding charged-particle-beam (CPB) transmitting void in a layer of CPB-scattering material deposited on a membrane, the void having an interior region including at least one CPB-scattering body so as to reduce, as the feature is being exposed on the exposure location, a net dose of charged particles imprinting the feature at the exposure location compared to a net dose of charged particles that would otherwise imprint the feature at the exposure location if the scattering body were not included in the interior region.

20. A method for manufacturing a device using charged-particle-beam microlithography, the method comprising the steps of:
(a) defining a pattern by a reticle, the pattern to be transferred onto a resist-coated substrate using a charged particle beam, the pattern including a feature tending to exhibit resist heating when exposed onto an exposure location on a resist-coated surface by the charged particle beam;
(b) forming the pattern on a stencil reticle such that the features in the pattern are divided into first and second sets of feature portions, the first set of feature portions being defined separately from the second set of feature portions; and
(c) separately exposing each set at the exposure location such that the first and second exposed sets collectively form the complete feature at the exposure location, the feature portions in each set being configured to reduce, as the complete feature is being exposed on the exposure location, a net dose of charged particles imprinting the feature at the exposure location compared to a net dose of charged particles that would otherwise imprint the feature at the exposure location if the feature were not divided.

* * * * *

UNITED STATES PATENT AND TRADEMARK OFFICE
CERTIFICATE OF CORRECTION

PATENT NO.   : 6,110,627
DATED        : August 29, 2000
INVENTOR(S)  : Mamoru Nakasuji It is certified that error appears in the above-identified patent and that said Letters Patent is hereby corrected as shown below:

Column 1,
Line 52, change "it not possible" to -- it is not possible --

Column 2,
Line 28, change "resistheating" to -- resist-heating --

Column 3,
Line 67, change "or CCD" to -- or a CCD --

Column 4,
Line 54, change "wafer 24" to -- wafer 124 --

Column 5,
Lines 64 and 65, change "$^{1}/20^{ths}$" to -- 1/20th --

Column 7,
Line 65, change "Adjacent edges" to -- Adjacent the edges --

Signed and Sealed this

Sixteenth Day of October, 2001

Attest:

*Attesting Officer*

NICHOLAS P. GODICI
*Acting Director of the United States Patent and Trademark Office*